United States Patent
Yao et al.

(10) Patent No.: US 11,233,194 B2
(45) Date of Patent: Jan. 25, 2022

(54) MEMRISTOR ELECTRODE MATERIAL PREPARATION METHOD AND APPARATUS, AND MEMRISTOR ELECTRODE MATERIAL

(71) Applicant: SHENZHEN WEITONGBO TECHNOLOGY CO., LTD., Shenzhen (CN)

(72) Inventors: Guofeng Yao, Shenzhen (CN); Jian Shen, Shenzhen (CN)

(73) Assignee: SHENZHEN WEITONGBO TECHNOLOGY CO., LTD., Shenzhen (CN)

(*) Notice: Subject to any disclaimer, the term of this patent is extended or adjusted under 35 U.S.C. 154(b) by 166 days.

(21) Appl. No.: 16/659,558

(22) Filed: Oct. 21, 2019

(65) Prior Publication Data

US 2020/0066974 A1 Feb. 27, 2020

Related U.S. Application Data

(63) Continuation of application No. PCT/CN2018/098334, filed on Aug. 2, 2018.

(51) Int. Cl.
*H01L 43/02* (2006.01)
*H01L 43/12* (2006.01)
(Continued)

(52) U.S. Cl.
CPC .......... *H01L 43/12* (2013.01); *C23C 14/0036* (2013.01); *C23C 14/0641* (2013.01); *C23C 14/5813* (2013.01); *H01L 43/02* (2013.01)

(58) Field of Classification Search
CPC ..... H01L 43/12; H01L 45/16; H01L 45/1625; C23C 14/0036; C23C 14/0641; C23C 14/5813; C23C 14/048
See application file for complete search history.

(56) References Cited

U.S. PATENT DOCUMENTS 8,362,454 B2 1/2013 Lee et al.
8,415,652 B2 4/2013 Yang et al.
(Continued)

FOREIGN PATENT DOCUMENTS

CN 101800173 A 8/2010
CN 102738389 A 10/2012
(Continued)

OTHER PUBLICATIONS

Niu, Gang et al. "Material insights of HfO2-based integrated 1-transistor-1-resistor resistive random access memory devices processed by batch atomic layer deposition" Scientific reports ,vol. 6: 28155, Jun. 17, 2016, doi:10.1038/srep28155.

*Primary Examiner* — Jaehwan Oh
(74) *Attorney, Agent, or Firm* — Scully Scott Murphy & Presser

(57) ABSTRACT

Embodiments of the present application provide a memristor electrode material preparation method and apparatus, and a memristor electrode material. The preparation method includes: depositing a metal nitride on a substrate by a reactive sputtering process to obtain a metal nitride substrate; and subjecting the metal nitride substrate to laser annealing treatment in a nitrogen-containing atmosphere to nitride an unreacted metal on the metal nitride substrate, so as to obtain a memristor electrode material.

20 Claims, 5 Drawing Sheets

(51) Int. Cl.
*C23C 14/00* (2006.01)
*C23C 14/06* (2006.01)
*C23C 14/58* (2006.01)

(56) References Cited

U.S. PATENT DOCUMENTS

| | | |
|---|---|---|
| 8,906,736 B1 | 12/2014 | Pham et al. |
| 2004/0180144 A1 | 9/2004 | Nagashima et al. |
| 2010/0087028 A1 | 4/2010 | Porthouse et al. |
| 2011/0245957 A1* | 10/2011 | Porthouse ......... H01L 21/67236 700/114 |
| 2011/0309321 A1 | 12/2011 | Yang et al. |
| 2012/0122284 A1* | 5/2012 | Kim ................. H01L 29/66545 438/287 |
| 2012/0122286 A1* | 5/2012 | Kim ................. H01L 29/66628 438/300 |
| 2012/0156819 A1 | 6/2012 | Zhu et al. |
| 2012/0202336 A1* | 8/2012 | Park ................. H01L 21/76229 438/435 |
| 2012/0295398 A1* | 11/2012 | Kurunczi ............. H01L 45/165 438/104 |
| 2012/0326267 A1* | 12/2012 | Song ............... H01L 21/823481 257/506 |
| 2013/0174781 A1 | 7/2013 | Zhu et al. |
| 2013/0200323 A1 | 8/2013 | Pham et al. |
| 2014/0038380 A1 | 2/2014 | Pham et al. |
| 2014/0103284 A1 | 4/2014 | Hsueh et al. |
| 2014/0224645 A1 | 8/2014 | Pham et al. |
| 2014/0264241 A1 | 9/2014 | Ananthan et al. |
| 2014/0357046 A1 | 12/2014 | Hsueh et al. |
| 2015/0053908 A1 | 2/2015 | Fowler |
| 2015/0162201 A1* | 6/2015 | Lee .................... H01L 21/28247 257/410 |
| 2015/0187910 A1* | 7/2015 | Kim .................. H01L 29/66545 438/294 |
| 2015/0221654 A1* | 8/2015 | Kim .................. H01L 21/02579 257/77 |
| 2015/0348773 A1* | 12/2015 | Zhu ..................... H01J 37/3426 438/503 |
| 2016/0035563 A1* | 2/2016 | Lin .................... H01L 21/67028 156/345.54 |
| 2016/0307927 A1* | 10/2016 | Lee ..................... H01L 29/0657 |
| 2017/0256609 A1* | 9/2017 | Bhuwalka ............ H01L 29/775 |
| 2017/0306474 A1* | 10/2017 | Kwak ................. C23C 14/5813 |
| 2018/0005939 A1* | 1/2018 | Hu .................... H01L 21/76802 |
| 2018/0019394 A1 | 1/2018 | Reid et al. |
| 2018/0144980 A1* | 5/2018 | Basu ................. H01L 21/02244 |
| 2019/0020343 A1* | 1/2019 | Lee ..................... H01L 23/5389 |
| 2019/0238134 A1* | 8/2019 | Lee ...................... H03K 19/1776 |
| 2019/0244088 A1* | 8/2019 | Yang ...................... H01L 27/24 |
| 2019/0245543 A1* | 8/2019 | Lee ......................... G11C 11/412 |
| 2019/0303104 A1* | 10/2019 | Yang .................... H01L 45/085 |
| 2019/0303744 A1* | 10/2019 | Yang .................... H01L 29/517 |
| 2020/0105633 A1* | 4/2020 | Lee ..................... H01L 23/5329 |
| 2020/0284924 A1* | 9/2020 | Mohammad ............. G01T 3/00 |

FOREIGN PATENT DOCUMENTS

| | | |
|---|---|---|
| CN | 103262215 A | 8/2013 |
| CN | 103413781 A | 11/2013 |
| CN | 105720193 A | 6/2016 |
| CN | 106299114 A | 1/2017 |
| CN | 106463340 A | 2/2017 |
| WO | 2013134757 A1 | 9/2013 |

* cited by examiner

300

Depositing a metal nitride on a substrate by a plasma enhanced atomic layer deposition, PEALD, process to obtain a metal nitride substrate — S310

Subjecting the metal nitride substrate to laser annealing under vacuum to obtain a memristor electrode material — S320

MEMRISTOR ELECTRODE MATERIAL PREPARATION METHOD AND APPARATUS, AND MEMRISTOR ELECTRODE MATERIAL

CROSS-REFERENCE TO RELATED APPLICATIONS

The present application is a continuation of international application No. PCT/CN2018/098334, filed on Aug. 2, 2018, which is hereby incorporated by reference in its entirety.

TECHNICAL FIELD

Embodiments of the present application relate to the field of resistive memory manufacturing, and more particularly, to a memristor electrode material preparation method and apparatus, and a memristor electrode material.

BACKGROUND

A resistive random access memory (RRAM) is a non-volatile memory that uses a variable resistance characteristic of a material to store information, and has advantages such as low power consumption, high density, fast reading and writing speed and good durability.

A basic memory cell of the RRAM is a memristor, and the memristor is mainly composed of a lower electrode, a resistive layer and an upper electrode. A working principle of the memristor is: when a positive voltage is applied between the two electrodes, a conductive filament is formed in the resistive layer, exhibiting a low resistance state; and when a RESET current is generated between the two electrodes, the conductive filament in the resistive layer is ruptured, exhibiting a high resistance state. Such variable resistance characteristic of the memristor achieves the effect of storing and rewriting of data '0' and '1'.

Compared with other non-volatile memories (such as a phase change memory and a magnetic memory), the RRAM has one great advantage that a memristor electrode material available to be adopted is compatible with the current mainstream complementary metal oxide semiconductor (CMOS) process without a need to introduce a special material. A metal nitride commonly used in a back end of line (BEOL) of a wafer foundry, for example, titanium nitride (TiN), tantalum nitride (TaN) and the like, can be used as an alternative material of a memristor electrode.

At present, a process for preparing a metal nitride mainly includes a metal-organic chemical vapor deposition (MOCVD) process and a reactive sputtering process, but there is still a gap between characteristics of metal nitrides prepared by the above processes and performance requirements of a memristor.

By taking preparation of titanium nitride (TiN) as an example, for the MOCVD process, tetrakis (dimethylamido) titanium is used as a precursor, and there is a problem of residual carbon in a product, which has a fatal effect on the reliability of a memristor. Compared with the MOCVD process, the reactive sputtering process does not have the problem of residual carbon. However, since density of plasma used in the reactive sputtering process is usually not high enough, an ionization rate of nitrogen is generally only about 50%, which results in that a part of titanium is deposited directly onto a substrate without nitridation. This part of titanium is liable to be oxidized in the air, which not only causes resistivity of a material to increase, but also affects erasing life of a memristor by diffusion of oxygen to a resistive layer. Therefore, how to prepare a memristor electrode material that meets performance requirements is an urgent problem to be solved in an RRAM manufacturing process.

SUMMARY

Embodiments of the present application provide a memristor electrode material preparation method and apparatus and a memristor electrode material.

In a first aspect, provided is a memristor electrode material preparation method, including: depositing a metal nitride on a substrate by a reactive sputtering process to obtain a metal nitride substrate; and subjecting the metal nitride substrate to laser annealing treatment in a nitrogen-containing atmosphere to nitride an unreacted metal on the metal nitride substrate, so as to obtain a memristor electrode material.

Optionally, in an embodiment of the present application, a metal source used for preparing the metal nitride is a high-purity metal target, which could avoid a problem of residual carbon in the prepared memristor electrode material.

Optionally, the metal in the metal nitride may be titanium (Ti), tungsten (W), tantalum (Ta), tungsten-titanium alloy (TW), or other metals, as long as the metal nitride is ensured to have good oxidation resistance, which is not limited by the embodiment of the present application.

Therefore, the memristor electrode material prepared according to the preparation method of the embodiment of the present application not only has good oxidation resistance, but also has advantages of low resistivity (for example, less than 100 $\mu\Omega\cdot cm$), substantially no residual carbon (for example, less than 1 atom %), low oxygen content (for example, less than 10 atom %), and high nitridation rate, that is, an atomic ratio of metal to nitrogen is closer to 1:1. Accordingly, an RRAM prepared by the memristor electrode material also has better performance, for example, higher reliability, longer erasing life, and the like.

In one possible implementation manner, the method further includes:

cleaning and drying the metal nitride substrate subjected to the laser annealing treatment.

In one possible implementation manner, an energy parameter of laser used in the laser annealing enables energy generated by the laser to be greater than or equal to energy required for a metal nitridation reaction, and to be less than energy required to cause damage to the metal nitride material.

In one possible implementation manner, the memristor electrode material is used for preparing a memristor electrode of a resistive memory, RRAM.

In one possible implementation manner, the method further includes: preparing the substrate for depositing the metal nitride.

In one possible implementation manner, the substrate is a silicon wafer.

In one possible implementation manner, the depositing the metal nitride on the substrate by the reactive sputtering process is performed in a first device, the subjecting the metal nitride substrate to the laser annealing treatment in the nitrogen-containing atmosphere is performed in a second device, and the first device is in vacuum connection with the second device.

In one possible implementation manner, the nitrogen-containing atmosphere includes at least one of the following gases: nitrogen, ammonia, and a mixed gas of nitrogen and hydrogen.

In a second aspect, provided is a memristor electrode material preparation method, including: depositing a metal nitride on a substrate by a plasma enhanced atomic layer deposition, PEALD, process to obtain a metal nitride substrate; and subjecting the metal nitride substrate to laser annealing treatment under vacuum to obtain a memristor electrode material.

Optionally, in an embodiment of the present application, a metal precursor used for preparing the metal nitride may be an inorganic substance, which could avoid a problem of residual carbon in the prepared memristor electrode material.

Optionally, the metal in the metal nitride may be titanium (Ti), tungsten (W), tantalum (Ta), tungsten-titanium alloy (TW), or other metals, as long as the metal nitride is ensured to have good oxidation resistance, which is not limited by the embodiment of the present application.

Therefore, the memristor electrode material prepared according to the preparation method of the embodiment of the present application not only has good oxidation resistance, but also has advantages of low resistivity (for example, less than 100 $\mu\Omega\cdot cm$), substantially no residual carbon (for example, less than 1 atom %), low oxygen content (for example, less than 10 atom %), and high nitridation rate, that is, an atomic ratio of metal to nitrogen is closer to 1:1. Accordingly, an RRAM prepared by the memristor electrode material also has better performance, for example, higher reliability, longer erasing life, and the like.

In some possible implementation manners, the method further includes:

cleaning and drying the metal nitride substrate subjected to the laser annealing treatment.

In one possible implementation manner, an energy parameter of laser used in the laser annealing enables energy generated by the laser to be greater than or equal to energy required for crystallization of the metal nitride, and to be less than energy required to cause damage to the metal nitride material.

In one possible implementation manner, the memristor electrode material is used for preparing a memristor electrode of a resistive memory, RRAM.

In one possible implementation manner, the method further includes:

preparing the substrate for depositing the metal nitride.

In one possible implementation manner, the substrate is a silicon wafer.

In one possible implementation manner, the depositing the metal nitride on the substrate by the plasma enhanced atomic layer deposition, PEALD, process includes:

in a first stage, introducing a metal precursor into a chamber in which the substrate is placed, the metal precursor including a metal in the metal nitride;

in a second stage, introducing a purge gas into the chamber to discharge the metal precursor that is not adsorbed on the substrate from the chamber;

in a third stage, introducing a reactive gas into the chamber, and initiating a chemical reaction between the reactive gas and the metal precursor adsorbed on the substrate in a plasma enhanced manner to obtain the metal nitride, where the reactive gas is a nitrogen-containing gas; and in a fourth stage, discharging a by-product of the reaction and the remaining reactive gas from the chamber by a purge gas.

In one possible implementation manner, the nitrogen-containing atmosphere includes at least one of the following gases: nitrogen, ammonia, and a mixed gas of nitrogen and hydrogen.

In a third aspect, provided is a memristor electrode material preparation method, including: depositing a metal nitride on a substrate by an arc ion plating process to obtain a memristor electrode material.

Optionally, in an embodiment of the present application, a metal source used for preparing the metal nitride is a high-purity metal target, which could avoid a problem of residual carbon in the prepared memristor electrode material.

Optionally, the metal in the metal nitride may be titanium (Ti), tungsten (W), tantalum (Ta), tungsten-titanium alloy (TW), or other metals, as long as the metal nitride is ensured to have good oxidation resistance, which is not limited by the embodiment of the present application.

Therefore, the memristor electrode material prepared according to the preparation method of the embodiment of the present application not only has good oxidation resistance, but also has advantages of low resistivity (for example, less than 100 $\mu\Omega\cdot cm$), substantially no residual carbon (for example, less than 1 atom %), low oxygen content (for example, less than 10 atom %), and high nitridation rate, that is, an atomic ratio of metal to nitrogen is closer to 1:1. Accordingly, an RRAM prepared by the memristor electrode material also has better performance, for example, higher reliability, longer erasing life, and the like.

In one possible implementation manner, the method further includes: cleaning and drying the memristor electrode material.

In one possible implementation manner, the method further includes: preparing the substrate for depositing the metal nitride.

In one possible implementation manner, the substrate is a silicon wafer.

In a fourth aspect, provided is a memristor electrode material preparation apparatus, including: a first device, configured to execute a reactive sputtering process to deposit a metal nitride on a substrate to obtain a metal nitride substrate; a second device, configured to subject the metal nitride substrate to laser annealing treatment to obtain a memristor electrode material; and a vacuum chamber, configured to connect the first device and the second device under vacuum.

In one possible implementation manner, the first device includes a first chamber provided with a metal target and a plasma generating apparatus, where the plasma generating apparatus is configured to bombard the metal target and ionize a working gas to produce a metal nitride; and the second device includes a second chamber provided with a laser, and a laser beam generated by the laser is used for annealing the metal nitride substrate.

In one possible implementation manner, a first gate is disposed between the first device and the vacuum chamber, and a second gate is disposed between the second device and the vacuum chamber, where, after the metal nitride substrate is obtained, the first gate is opened to move the metal nitride substrate to the vacuum chamber, then the first gate is closed and the second gate is opened to move the metal nitride substrate to the second chamber.

In one possible implementation manner, a performance index of the metal nitride satisfies the following conditions:
resistivity is lower than a first threshold, residual of a carbon element is lower than a second threshold, an oxygen content is lower than a third threshold, and an absolute value of a difference between a ratio between a number of atoms of metal and a number of atoms of nitrogen, and 1 is less than a fourth threshold.

In one possible implementation manner, the first threshold is 100 micro-ohm centimeters, the second threshold is 1 atom percent, the third threshold is 10 atom percent, and the four threshold is 0.1.

In one possible implementation manner, the memristor electrode material is used for preparing a memristor electrode of a resistive memory.

In a fifth aspect, provided is a memristor electrode material, where the memristor electrode material is prepared by the preparation method according to the first aspect or any of the possible implementation manners of the first aspect, or prepared by the preparation method according to the second aspect or any of the possible implementation manners of the second aspect, or prepared by the preparation method according to the third aspect or any of the possible implementation manners of the third aspect.

In one possible implementation manner, a performance index of a metal nitride in the memristor electrode material satisfies the following conditions: resistivity is lower than a first threshold, residual of a carbon element is lower than a second threshold, an oxygen content is lower than a third threshold, and an absolute value of a difference between a ratio between a number of atoms of metal and a number of atoms of nitrogen, and 1 is less than a fourth threshold.

In one possible implementation manner, the first threshold is 100 micro-ohm centimeters, the second threshold is 1 atom percent, the third threshold is 10 atom percent, and the four threshold is 0.1.

In one possible implementation manner, the memristor electrode material is used for preparing a memristor electrode of a resistive memory, RRAM.

DESCRIPTION OF EMBODIMENTS

A clear description of technical solutions of embodiments of the present application will be given below, in combination with the accompanying drawings in the embodiments of the present application.

Hereinafter, a memristor electrode material preparation method according to an embodiment of the present application will be described with reference to FIGS. 1 to 6. It should be understood that FIGS. 1 to 6 show main steps or operations of the preparation method of the embodiment of the present application. However, these steps or operations are merely examples, and the embodiment of the present application may also perform other operations or variations of various operations of FIGS. 1 to 6. In addition, various steps in a method embodiment of the present application may also be performed in orders different from those as described in the method embodiment, and it is possible that not all operations in the method embodiment are performed.

Figure 1:
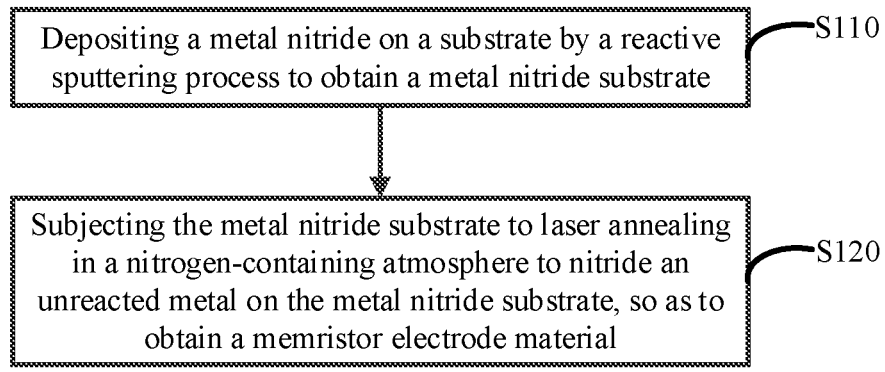
FIG. 1 is a schematic flow chart of a memristor electrode material preparation method according to an embodiment of the present application.

FIG. 1 is a schematic flowchart of a memristor electrode material preparation method 100 according to an embodiment of the present application. As shown in FIG. 1, the method 100 may include:

S110, depositing a metal nitride on a substrate by a reactive sputtering process to obtain a metal nitride substrate; and S120, subjecting the metal nitride substrate to laser annealing treatment in a nitrogen-containing atmosphere to nitride an unreacted metal on the metal nitride substrate, so as to obtain a memristor electrode material.

It should be noted that the metal nitride substrate obtained by S110 is a substrate on which a metal nitride is deposited, that is, the metal nitride substrate is a combined structure of a metal nitride and a substrate; the memristor electrode material prepared by the preparation method 100 according to the embodiment of the present application is the metal nitride on the substrate; and therefore, the memristor electrode material may also be referred to as a metal nitride electrode material or a metal nitride material, or the like. In an embodiment of the present application, the above terms may be used interchangeably. That is, the metal nitride obtained after the above preparation steps may be used as an electrode for preparing a memristor in an RRAM.

Specifically, a working principle of the reactive sputtering process is: a RF plasma generating apparatus generates plasma to bombard a metal target in a vacuum environment, so that a sputtered metal atom reacts with a reactive gas (a nitrogen-containing gas) ionized by the plasma to eventually generate a metal nitride deposited on the substrate.

However, in S110, since density of the plasma is usually not high enough, ionization rate of nitrogen is usually not high, generally only about 50%, which results in that the unnitrided metal is directly deposited on the substrate eventually. As such, what is deposited on the substrate is actually a mixture of metal and metal nitride. Since the metal is easily oxidized in the air, not only electrical resistivity of the electrode material is caused to increase, but also erasing life of the memristor may be affected.

In one implementation manner, the metal nitride may be subject to annealing treatment at a high temperature (greater than 900° C.) in a nitrogen-containing atmosphere to nitride the unnitrided metal, thereby increasing a nitridation rate of the metal and further reducing resistivity of the metal nitride. However, a temperature of an annealing process allowed in a BEOL process does not exceed 420° C. Therefore, it is not feasible to perform annealing treatment at a high temperature (greater than 900° C.) in a nitrogen-containing atmosphere in the BEOL process.

Based on the technical problem, in the embodiment of the present application, the metal nitride substrate prepared in S110 may be subjected to laser annealing treatment in a nitrogen-containing atmosphere to nitride an unnitrided metal. Due to a transient (usually a picosecond to a microsecond) high temperature (for example, greater than 1000 degrees) of the laser annealing, heat is only concentrated on a surface and does not cause damage to the substrate under the metal nitride, so it can be used in a BEOL process. Moreover, the treatment of the metal nitride substrate by the laser annealing process could increase a nitridation rate of the metal and reduce resistivity of the metal nitride. Therefore, the prepared memristor electrode material has advantages of high nitridation rate and low resistivity.

Figure 2:
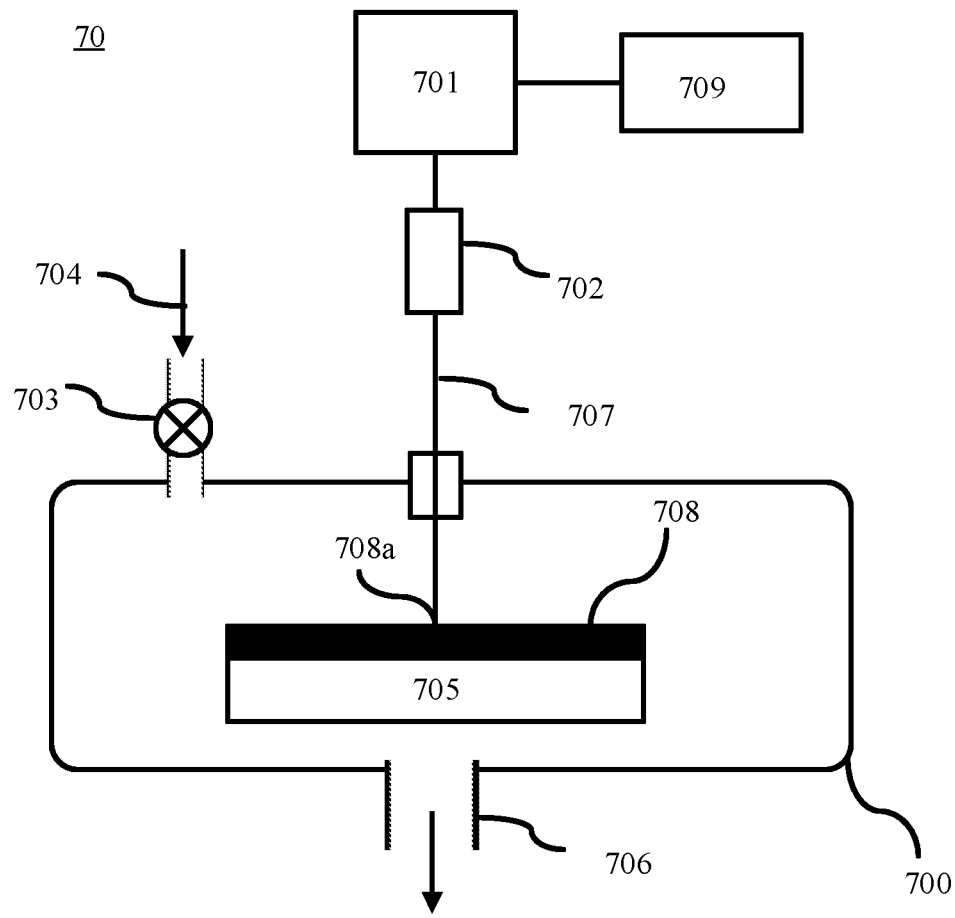
FIG. 2 is a schematic structural diagram of a device for executing a laser annealing process in a nitrogen-containing atmosphere.

FIG. 2 is a schematic structural diagram of a device 70 for executing a laser annealing process, and the device 70 may include:

a chamber 700 provided with a working table 705 for placing a metal nitride substrate obtained by a reactive sputtering process;

a laser 701 configured to generate a laser beam 707 for subjecting the metal nitride substrate to annealing treatment;

a shaper 702 configured to convert the generated laser beam 707 into a flat top spot with uniformly distributed energy; and a power source 709 configured to control turn-on and turn-off of the laser.

Optionally, the device 70 may further include:

a controller configured to control movement of the working table 705, and further control an energy parameter of laser such that resistivity of the metal nitride is reduced to the utmost extent without causing damage to the metal nitride material.

Referring to FIG. 2, by taking preparation of TiN as an example, a specific execution process of S120 is illustrated.

First, in S121, the chamber 700 is evacuated by an air pump 706 into a vacuum state, then a valve 703 is opened to fill a nitrogen-containing gas 704 of a certain pressure, so as to ensure that the laser annealing is performed in the nitrogen-containing atmosphere.

Then, in S122, the power source 709 is turned on, and the laser 701 generates the laser beam 707 which is converted by the shaper 702 into a laser spot with uniformly distributed energy to be incident on a first region 708a on a TiN substrate 708, and the first region 708a is subject to thermal annealing.

After S122, the power source 709 is turned off, the working table 705 is controlled to move to the next position, and further, other regions on the TiN substrate may be subject to laser annealing according to the process described in S122 until the whole surface of the TiN substrate 708 is subjected to laser annealing. So far, annealing treatment of the TiN substrate is completed.

Optionally, in some embodiments, the method 100 may further include:

cleaning and drying the metal nitride substrate subjected to the laser annealing treatment.

Specifically, after the laser annealing treatment, a particle usually remains on the surface of the metal nitride substrate, and in order to avoid influence of the particle on performance of an RRAM, the metal nitride substrate may be cleaned by a cleaning process, for example, the surface of the metal nitride substrate may be cleaned with deionized water. Further, the cleaned metal nitride substrate may be dried to obtain the memristor electrode material.

Optionally, in some embodiments, the memristor electrode material may be further processed to obtain upper and lower electrodes of the memristor. For example, the metal nitride electrode material may be processed by photolithography and etching processes to obtain the upper and lower electrodes of the memristor.

Optionally, in the embodiment of the present application, a metal source used for preparing the metal nitride may be a high-purity metal target, which is beneficial to avoid a problem of residual carbon in the prepared memristor electrode material.

Optionally, in the embodiment of the present application, the metal in the metal nitride may be titanium (Ti), tungsten (W), tantalum (Ta), tungsten-titanium alloy (TW), or other metals, as long as the metal nitride is ensured to have good oxidation resistance, which is not limited by the embodiment of the present application.

Therefore, the memristor electrode material prepared according to the preparation method of the embodiment of the present application not only has good oxidation resistance, but also has advantages of low resistivity (for example, less than 100 μΩ·cm), substantially no residual carbon (for example, less than 1 atom %), low oxygen content (for example, less than 10 atom %), and high nitridation rate, that is, an atomic ratio of metal to nitrogen is closer to 1:1. Accordingly, an RRAM prepared by the memristor electrode material also has better performance, for example, higher reliability, longer erasing life, and the like.

It should be noted that the metal nitride electrode material prepared by the preparation method according to the embodiment of the present application may be used as an electrode material of a memristor in an RRAM, and may also be used on other devices having a high performance requirement on a metal nitride. The embodiment of the present application is only described by an example where the metal nitride electrode material is used for preparing a memristor electrode, and is not limited to a specific application scenario.

Optionally, in S120, the type of laser used for laser annealing may be determined according to transmittance of the metal nitride, thereby improving annealing efficiency of the metal nitride. For example, titanium nitride has higher transmittance for a visible light wavelength, and therefore, for laser annealing of titanium nitride, a laser in a visible light wavelength may be preferably adopted, which is beneficial to improve the annealing efficiency.

Optionally, in S120, an energy parameter of laser used in the laser annealing may be controlled such that energy generated by the laser is greater than energy required for a metal nitridation reaction, and is less than energy required to cause damage to the metal nitride material. That is, the unnitrided metal could be nitrided to the utmost extent without causing damage to the material.

It should be understood that the reactive sputtering process is one of physical vapor deposition (PVD) processes, and in S110, the metal nitride may also be prepared by other PVD processes, for example, vacuum evaporation, ion plating process, or the like, which is not limited by the embodiment of the present application.

Optionally, in the embodiment of the present application, the substrate for depositing the metal nitride may be a silicon wafer or other semiconductor structures, which is not limited by the embodiment of the present application. It should be understood that the substrate may include a circuit structure that may be configured to achieve a specific function, for example, if the metal nitride electrode material is used for preparing upper and lower electrodes of a memristor in an RRAM, the circuit structure in the substrate may be configured to achieve switching of a resistance state of the memristor.

Optionally, in the embodiment of the present application, S110 may be performed in a first device, and S120 may be performed in a second device, and the first device is in vacuum connection with the second device. As such, it is beneficial to avoid oxidation of the metal nitride substrate during movement from the first device to the second device, so that an oxygen content of the prepared metal nitride electrode material could be reduced.

Alternatively, S110 and S120 may be also considered to be performed in an integrated apparatus in which the reactive sputtering process and the laser annealing process can be performed, thereby avoiding a problem of material oxidation during transport.

Hereinafter, a structure of the integrated device and specific working processes will be described in detail with reference to FIG. 3.

Figures 3, 4:
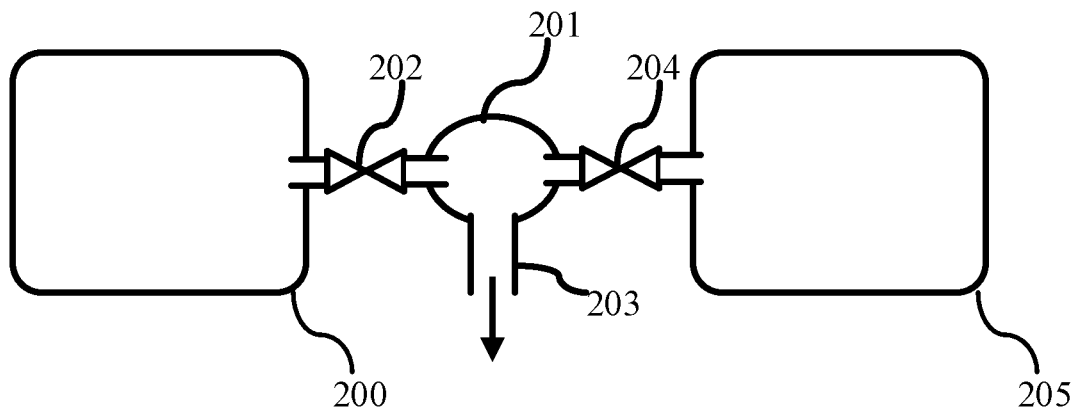
FIG. 3 is a schematic structural diagram of an apparatus for executing a reactive sputtering process and a laser annealing process.
FIG. 4 is a schematic flow chart of a memristor electrode material preparation method according to another embodiment of the present application.

FIG. 3 shows a schematic structural diagram of an integrated apparatus 20 for executing a reactive sputtering process and a laser annealing process. It should be understood that a structure of the integrated apparatus 20 is merely an example rather than a limitation, as long as the reactive sputtering process and the laser annealing process could be executed. An embodiment of the present application does not limit a specific structure.

As shown in FIG. 3, the integrated apparatus 20 includes:
a first device 200 configured to execute a related process of a reactive sputtering process;
a second device 205 configured to execute a related process of a laser annealing process; and
a vacuum chamber 201 configured to connect the first device 200 and the second device 205 under vacuum.

The first device 200 is connected to the vacuum chamber 201 by a gate 202, the second device 205 is connected to the vacuum chamber 201 by a gate 204, and a specific structure of the second device 205 may refer to FIG. 2.

Hereinafter, by taking preparation of a TiN electrode material as an example, a specific working process is described in detail.

First, in step 1a, a reactive sputtering process is executed in the first device 200 to deposit TiN on a substrate. During the process, the first device 200 is in a vacuum environment.

For the specific process, reference may be made to the related description of S110, and details are not described herein.

Next, in step 1b, the vacuum chamber 201 is evacuated to be in a vacuum state by a vacuum pump 203, then the gate 202 between the first device 200 and the vacuum chamber 201 is opened to move the prepared TiN substrate to the vacuum chamber 201, and then the gate 202 is closed.

Further, in step 1c, a nitrogen-containing gas, such as ammonia, nitrogen and a mixed gas of nitrogen and hydrogen, is introduced into the second device 205, then the gate 204 is opened to transmit the TiN substrate to the second device 205, and the gate 204 is closed.

Then, in step 1d, the TiN substrate is subject to laser annealing in the nitrogen-containing atmosphere, so as to nitride the unnitrided titanium in the TiN substrate.

Optionally, the TiN substrate obtained after the laser annealing may further be cleaned and dried to obtain a TiN electrode material. For a specific implementation process, reference may be made to the foregoing embodiments, and details are not described herein again.

Similarly, a metal nitride such as tantalum nitride, tungsten nitride, and titanium tungsten nitride may also be prepared according to the above steps, as long as a metal source is changed, and details are not described herein again.

A memristor electrode material preparation method according to an embodiment of the present application is described in detail above with reference to FIGS. 1 to 3.

Hereinafter, a memristor electrode material preparation method according to another embodiment of the present application will be described with reference to FIGS. 4 to 6. It should be understood that detailed description of the same process is omitted for the sake of brevity.

FIG. 4 is a schematic flowchart of a memristor electrode material preparation method 300 according to another embodiment of the present application. As shown in FIG. 4, the method 300 may include:

S310, depositing a metal nitride on a substrate by a plasma enhanced atomic layer deposition (PEALD) process to obtain a metal nitride substrate; and S320, subjecting the metal nitride substrate to laser annealing under vacuum to obtain a memristor electrode material.

It should be noted that the metal nitride substrate prepared in S310 is a substrate on which a metal nitride is deposited, that is, the metal nitride substrate is a combined structure of a metal nitride and a substrate; the memristor electrode material prepared by the preparation method 300 according to the embodiment of the present application is the metal nitride on the substrate; and therefore, the memristor electrode material may also be referred to as a metal nitride electrode material or a metal nitride material, or the like. In an embodiment of the present application, the above terms may be used interchangeably. That is, the metal nitride obtained after the above preparation steps may be used as an electrode for preparing a memristor in an RRAM.

Specifically, the plasma enhanced atomic layer deposition (PEALD) is one of atomic layer deposition (ALD) processes. A working principle of the PEALD process is: a metal precursor is allowed to sufficiently react with a reactive gas (for example, a nitrogen-containing gas) by virtue of activation energy provided by plasma so as to obtain a metal nitride.

Compared with other ALD processes, for example, thermal atomic layer deposition (TALD) process, the PEALD process can prepare a metal nitride with a metal having a higher nitridation rate, or an atomic ratio of metal to nitrogen in the prepared metal nitride electrode material is closer to 1:1. Therefore, the PEALD process is beneficial to prepare a metal nitride electrode material having excellent performance.

In general, the metal nitride prepared by the PEALD process has problems of poor crystallinity and high resistivity, for example, typically exceeding 1000 micro-ohm centimeters (μΩ·cm), which has a larger gap with a resistivity requirement of an electrode material for a metal nitride (generally no more than 100 μΩ·cm), and use of the metal nitride to prepare a memristor electrode will bring additional line resistance to an RRAM.

In one implementation manner, the metal nitride may be subjected to annealing at a high temperature (greater than 500° C.) to increase crystallinity and reduce resistivity of the metal nitride, however, a temperature of an annealing process allowed in a BEOL process does not exceed 420° C., and therefore, the conventional annealing process is not feasible in the BEOL process.

Based on the technical problem, in the embodiment of the present application, the metal nitride substrate prepared in S310 may be subjected to treatment by a laser annealing process. Since the laser annealing usually causes a metal nitride to complete a crystallization process by a transient (usually a picosecond to a microsecond) high temperature (for example, greater than 1000 degrees), crystallinity is increased, and accordingly, resistivity is reduced without affecting the substrate under the metal nitride. Therefore, the treatment of the metal nitride substrate by the laser annealing process could not only achieve the effect of reducing resistivity in the conventional high temperature annealing process, but also be compatible with the BEOL process without damaging a circuit structure in the substrate (for example, a metal interconnecting wire), and thus is feasible in practice.

Optionally, in some embodiments, the method 300 may further include:

cleaning and drying the metal nitride substrate subjected to the laser annealing treatment.

Specifically, after the laser annealing treatment, a particle usually remains on the surface of the metal nitride substrate, and in order to avoid influence of the particle on performance of an RRAM, the metal nitride substrate may be cleaned by a cleaning process, for example, the surface of the metal nitride substrate may be cleaned with deionized water. Further, the cleaned metal nitride substrate may be dried to obtain the memristor electrode material.

Optionally, in some embodiments, the memristor electrode material may be further processed to obtain upper and lower electrodes of the memristor. For example, the metal nitride electrode material may be processed by photolithography and etching processes to obtain the upper and lower electrodes of the memristor.

Optionally, in the embodiment of the present application, the metal precursor used for preparing the metal nitride may be an inorganic substance, which could avoid a problem of residual carbon in the prepared memristor electrode material. For example, for titanium nitride preparation, titanium tetrachloride ($TiCl_4$) may be used as a metal precursor.

Optionally, in the embodiment of the present application, the metal in the metal nitride may be titanium (Ti), tungsten (W), tantalum (Ta), tungsten-titanium alloy (TW), or other metals, as long as the metal nitride is ensured to have good oxidation resistance, which is not limited by the embodiment of the present application.

Therefore, the memristor electrode material prepared according to the preparation method of the embodiment of the present application not only has good oxidation resistance, but also has advantages of low resistivity (for example, less than 100 $\mu\Omega\cdot cm$), substantially no residual carbon (for example, less than 1 atom %), low oxygen content (for example, less than 10 atom %), and high nitridation rate, that is, an atomic ratio of metal to nitrogen is closer to 1:1. Accordingly, an RRAM prepared by the memristor electrode material also has better performance, for example, higher reliability, longer erasing life, and the like.

It should be noted that the metal nitride electrode material prepared by the preparation method according to the embodiment of the present application may be used as an electrode material of a memristor in an RRAM, and may also be used on other devices having a high performance requirement on a metal nitride. The embodiment of the present application is described by an example where the metal nitride electrode material is used for preparing a memristor electrode, and is not limited to a specific application scenario.

Optionally, in the embodiment of the present application, S310 may be performed once or may be performed several times. Each time it is performed, a certain thickness of metal nitride may be deposited on the substrate, and specific execution times of S310 may be determined according to a deposition thickness of the PEALD process each time and a required thickness of the metal nitride, which is not limited by the embodiment of the present application.

Optionally, in S320, the type of laser used for laser annealing may be determined according to transmittance of the metal nitride, thereby improving annealing efficiency of the metal nitride. For example, titanium nitride has higher transmittance for a visible light wavelength, and therefore, for laser annealing of titanium nitride, a laser in a visible light wavelength may be preferably adopted, which is beneficial to improve the annealing efficiency.

Optionally, in S320, an energy parameter of laser used in the laser annealing may be controlled such that energy generated by the laser is greater than energy required for a metal nitridation reaction, and is less than energy required to cause damage to the metal nitride material. That is, the unnitrided metal could be nitrided to the utmost extent without causing material damage.

Optionally, in the embodiment of the present application, the substrate may be a silicon wafer or other semiconductor structures, which is not limited by the embodiment of the present application. It should be understood that in the embodiment of the present application, the substrate may include a circuit structure that may be used to achieve a specific function, for example, if the electrode material is used for preparing upper and lower electrodes of a memristor, the circuit structure in the substrate may be used to achieve switching of a resistance state of the memristor, for example, from a low resistance state to a high resistance state.

Hereinafter, a specific execution process of the preparation method 300 according to the embodiment of the present application will be described in detail with reference to FIGS. 5 and 6.

Figure 5:
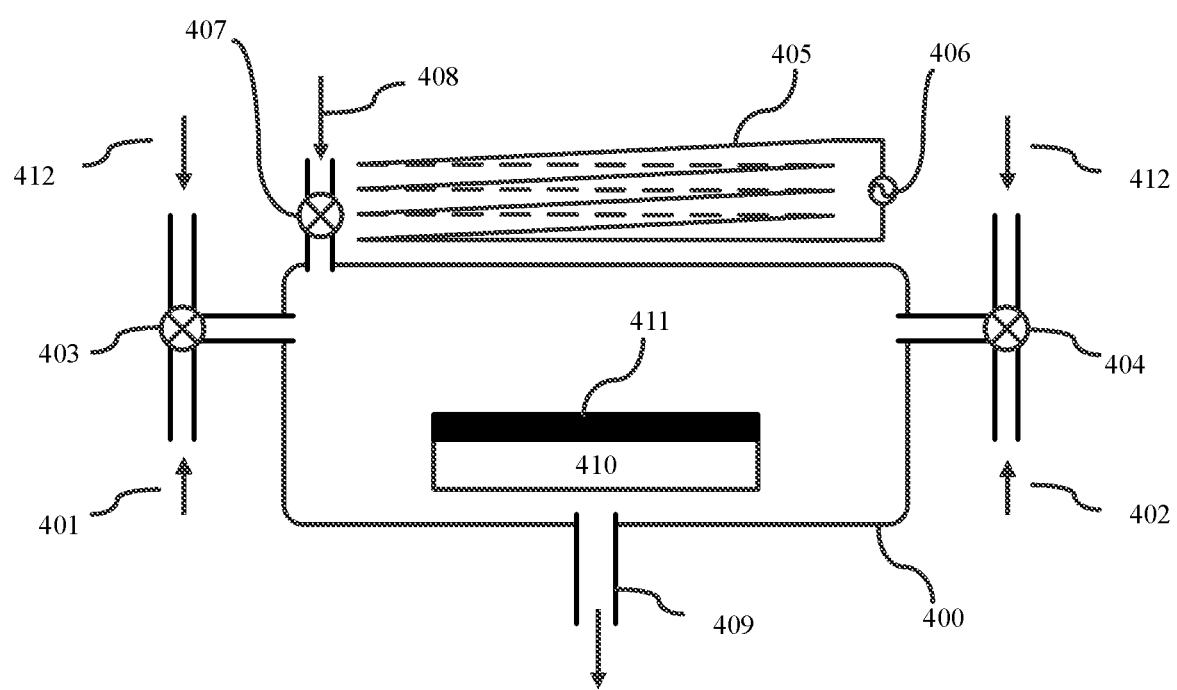
FIG. 5 is a schematic structural diagram of a device for executing a PEALD process.

FIG. 5 shows a schematic structural diagram of a device 40 for executing a PEALD process. FIG. 6 shows a schematic structural diagram of a device 50 for executing a laser annealing process. It should be understood that structures of the device 40 and the device 50 are merely examples rather than limitations, as long as the corresponding processes could be executed. An embodiment of the present application does not limit specific structures.

Optionally, in the embodiment, the PEALD process and the laser annealing process may also be executed in the same apparatus, as long as the apparatus includes a means or a device capable of implementing a PEALD process and a laser annealing process, which is not limited by the embodiment of the present application.

As shown in FIG. 5, the device 40 may include:

a first chamber 400 provided with a working table 410 for placing a substrate 411 to be processed.

Optionally, the working table 410 may be heated to control a temperature of the substrate 411 during the process of depositing a metal nitride. In a specific embodiment, the temperature range may be between 150° C. and 350° C. to allow sufficient reaction of a metal precursor and nitrogen.

The first chamber 400 is further provided with a valve 403, a valve 404 and a valve 407 for controlling inflow and outflow as well as volume of flow of a gas during execution of the PEALD process.

The device 40 may also include a plasma generating apparatus for generating plasma to assist in chemical reaction of the metal precursor with nitrogen to enhance the nitridation rate of the metal. The plasma generating apparatus may include a coil 405 and a radio frequency power source 406.

Figure 6:
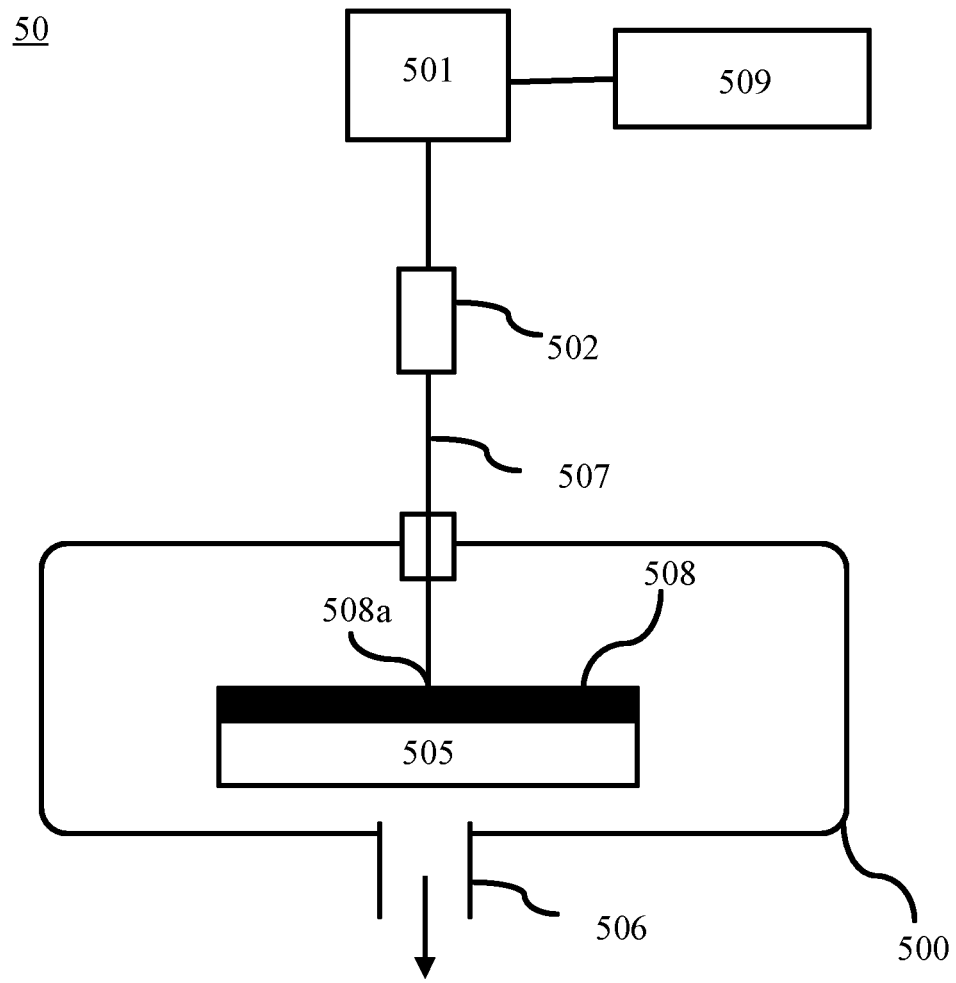
FIG. 6 is a schematic structural diagram of a device for executing a laser annealing process under vacuum.

As shown in FIG. 6, the device 50 may include:

a second chamber 500 provided with a working table 505 for placing a metal nitride substrate obtained by a PEALD process;

a laser 501 configured to generate a laser beam 507 for subjecting the metal nitride substrate to annealing treatment;

a shaper 502 configured to convert the generated laser beam 507 into a flat top spot with uniformly distributed energy; and a power source 509 configured to control turn-on and turn-off of the laser.

Optionally, the device 50 may further include:

a controller configured to control movement of the working table 505, and further control an energy parameter of the laser such that resistivity of the metal nitride is reduced to the utmost extent without causing damage to the metal nitride material.

Hereinafter, by taking preparation of a TiN electrode material as an example, specific processes of S310 and S320 are described in detail:

Referring to FIG. 5, specific steps of S310 are illustrated.

First, in step 2a, the valve 403 is opened, and a certain flow of a metal precursor 401 is introduced into the first chamber 400 for a duration $t_1$.

The metal precursor 401 is a titanium-containing gas, for example, titanium tetrachloride ($TiCl_4$).

Next, in step 2b, a purge gas 412 is introduced into the first chamber 400 for a duration $t_2$ to discharge the precursor 401 that is not adsorbed on the surface of the substrate 411 from the first chamber 400.

The purge gas 412 may be an inert gas such as argon (Ar).

Then, in step 2c, a certain flow of reactive gas 402 is introduced into the first chamber 400 for a duration $t_3$ to initiate a chemical reaction between the metal precursor 401 and the reactive gas 402 so as to obtain titanium nitride.

The reactive gas 402 may be a nitrogen-containing gas, for example, ammonia ($NH_3$), nitrogen, or a mixed gas of nitrogen and hydrogen, which is not limited by the embodiment of the present application. Hereinafter, description is given by taking the reactive gas being $NH_3$ as an example.

In step 2c, the coil 405 and the RF power source 406 serve as essential parts of the plasma generating apparatus such that the argon gas 408 introduced into the first chamber 400 could generate an inductively coupled plasma (ICP). The ICP could allow the metal precursor 401 to react with the reactive gas 402 more sufficiently, thereby enhancing the nitridation rate of the metal.

Finally, in step 2d, a purge gas 412 is introduced into the first chamber 400 for a duration $t_4$ to discharge a by-product (hydrogen chloride) of the reaction and the remaining reactive gas 402 from the first chamber 400.

After the above steps, titanium nitride of a certain thickness is deposited on the substrate 411, and the thickness is at about a sub-Angstrom level. If thicker titanium nitride is desired, the above steps may be repeatedly executed several times, for example, thousands of times. Thus, a titanium nitride electrode material having a thickness of several tens to several hundreds of nanometers could be obtained, and the specific number of execution times may be determined according to a desired thickness of titanium nitride, which is not limited by the embodiment of the present application.

Optionally, in the embodiment of the present application, performance of the prepared titanium nitride electrode material may be improved by controlling a process parameter such as gas flow, duration of each step, and power of the RF power source. For example, the gas flows of the metal precursor 401 and the reactive gas 402 introduced into the first chamber 400 and the durations $t_1$ and $t_3$ may be controlled such that an atomic ratio of titanium to nitrogen is less than or equal to 1:1 to maximize the nitridation of titanium, or power of the radio frequency power source may be controlled to be greater than a certain value to make the reaction of the metal precursor 401 and the reactive gas 402 more sufficient.

Specific steps of S320 are illustrated with reference to FIG. 6.

First, in step 2e, the second chamber 500 is evacuated by an air pump 506 to be in a vacuum state, in order to ensure that laser annealing is performed in a vacuum environment, thereby preventing an unnitrided metal from being oxidized.

Next, in step 2f, the power source 509 is turned on, and the laser 501 generates a laser beam 507 which is converted by the shaper 502 into a laser spot with uniformly distributed energy to be incident on a first region 508*a* on a TiN substrate 508, and the first region 508*a* is subject to thermal annealing.

After step 2f, the power source 509 is turned off, and the working table 505 is controlled to move to the next position. Further, other regions on the TiN substrate may be subject to laser annealing according to the process described in step 2f until the whole surface of the TiN substrate 508 is subjected to laser annealing.

Further, the TiN substrate may further be cleaned and dried to obtain a memristor electrode material. For a specific process, reference may be made to the foregoing embodiments, and details are not described herein again.

Similarly, a metal nitride such as tantalum nitride, tungsten nitride, and titanium tungsten nitride may also be prepared according to the above steps 2a to 2f, as long as a metal in a metal precursor is replaced with a corresponding metal, and details are not described herein again.

It should be understood that, in the embodiment of the present application, the metal nitride may also be deposited on the substrate by using an arc ion plating process to obtain the metal nitride substrate, that is, in S110 or S310, an arc ion plating process may be adopted to prepare the metal nitride, and other steps may be similar to the preparation method 100 or the preparation method 300. A working principle of the arc ion plating process is: in a vacuum environment, a metal target is evaporated and ionized by using arc discharge, and then reacts with nitrogen to form a metal nitride deposited on a substrate. Since an ionization rate of a metal in the arc ion plating process is high, a nitridation rate of the metal is accordingly high as well. Therefore, the arc ion plating process is beneficial to prepare a memristor electrode material having a high nitridation rate.

Therefore, for the preparation method 100, if the metal nitride is prepared by an arc ion plating process in S110, the prepared metal nitride has no problem of low nitridation rate, and therefore, it is not necessary to execute S120. Of course, S120 may also be executed to further enhance the nitridation rate of the metal.

Alternatively, for the preparation method 300, if the metal nitride is prepared by an arc ion plating process in S310, the prepared memristor electrode material has no problem of high resistivity, and therefore, it is not necessary to execute S320. Of course, S320 may also be executed to further reduce the resistivity of the electrode material.

Figure 7:
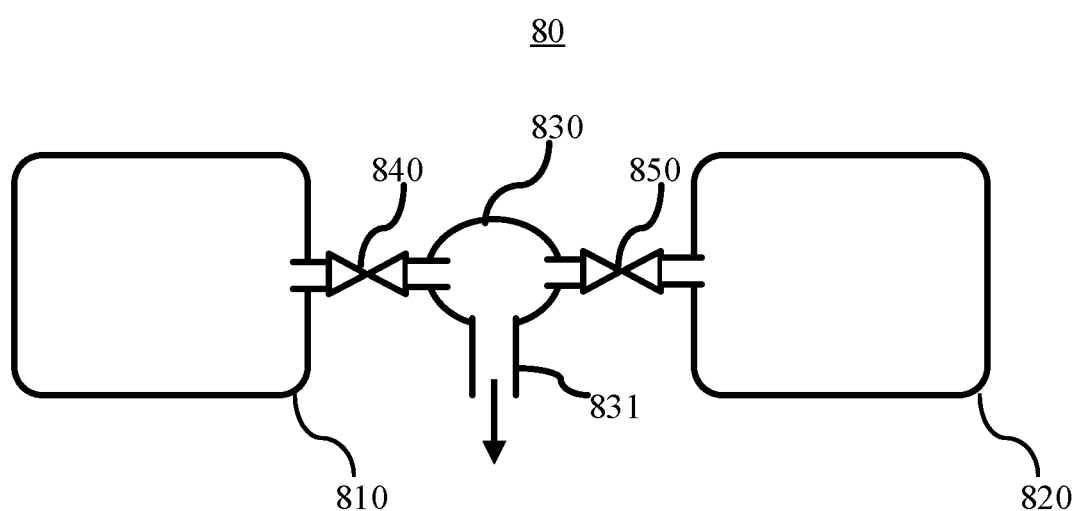
FIG. 7 is a schematic structural diagram of a memristor electrode material preparation apparatus according to an embodiment of the present application.

An embodiment of the present application further provides a memristor electrode material preparation apparatus 80. As shown in FIG. 7, the preparation apparatus 80 includes:

a first device 810 configured to execute a reactive sputtering process to deposit a metal nitride on a substrate to obtain a metal nitride substrate;

a second device 820 configured to subject the metal nitride substrate to laser annealing treatment to obtain a memristor electrode material; and a vacuum chamber 830 configured to connect the first device 810 and the second device 820 under vacuum.

Therefore, in the embodiment of the present application, the reactive sputtering process and the laser annealing process may be executed in the same apparatus, and the first device for executing the reactive sputtering process is in vacuum connection with the second device for executing the laser annealing process, which could avoid a problem that the metal nitride substrate is oxidized during transport.

Optionally, in some embodiments, the first device includes a first chamber provided with a metal target and a plasma generating apparatus, where the plasma generating apparatus is configured to bombard the metal target and ionize a working gas to produce a metal nitride; and the second device includes a second chamber provided with a laser, and a laser spot generated by the laser is used for annealing the metal nitride substrate.

A specific working process is as follows: in a first stage, an inert gas ion in the first chamber bombards the metal target to generate a metal ion, the metal ion chemically reacts with a nitrogen-containing gas ionized by the inert gas ion to obtain a metal nitride, and the metal nitride is deposited on the substrate in the first chamber to obtain the metal nitride substrate.

In a second stage, the metal nitride substrate is moved to the second chamber through the vacuum chamber.

In a third stage, the laser in the second chamber is turned on, and the metal nitride substrate is subject to laser annealing by a laser beam generated by the laser.

Optionally, in some embodiments, a first gate 840 is disposed between the first device and the vacuum chamber, and a second gate 850 is disposed between the second device and the vacuum chamber.

In the second stage, the first gate is opened to move the metal nitride substrate to the vacuum chamber, then the first gate is closed, and the second gate is opened to move the metal nitride substrate to the second chamber such that the metal nitride substrate is not oxidized during transport.

It should be understood that the preparation apparatus 80, the first device 810, and the second device 820 may be respectively similar to the apparatus 20, the first device 200 and the second device 205 as described above. For related description, reference may be made to the foregoing embodiments, and details are not described herein again.

Optionally, in some embodiments, a performance index of the metal nitride prepared by adopting the preparation apparatus 80 satisfies the following conditions:

resistivity is lower than a first threshold, residual of a carbon element is lower than a second threshold, an oxygen content is lower than a third threshold, and an absolute value of a difference between a ratio between a number of atoms of metal and a number of atoms of nitrogen, and 1 is less than a fourth threshold.

Optionally, in some embodiments, the first threshold is 100 micro-ohm centimeters, the second threshold is 1 atom percent, the third threshold is 10 atom percent, and the fourth threshold is 0.1.

Optionally, in some embodiments, the memristor electrode material is used for preparing a memristor electrode of a resistive memory, RRAM.

An embodiment of the present application further provides a memristor electrode material prepared by the preparation method according to the foregoing embodiments.

Optionally, in some embodiments, a performance index of a metal nitride in the memristor electrode material satisfies the following conditions: resistivity is lower than a first threshold, residual of a carbon element is lower than a second threshold, an oxygen content is lower than a third threshold, and an absolute value of a difference between a ratio between a number of atoms of metal and a number of atoms of nitrogen, and 1 is less than a fourth threshold.

Optionally, the first threshold is 100 micro-ohm centimeters, the second threshold is 1 atom percent, the third threshold is 10 atom percent, and the four threshold is 0.1.

Optionally, in some embodiments, the memristor electrode material is used for preparing a memristor electrode of a resistive memory, RRAM.

It should be noted that embodiments shown in FIGS. 1 to 6 are possible implementation manners, or preferred implementation manners, of a memristor electrode material preparation method according to an embodiment of the present application. Other implementation manners resulting from the resistor electrode material preparation method according to the embodiment of the present application also fall within the scope of protection of the embodiment of the present application.

It should be understood that, the resistor electrode material preparation method of the embodiment of the present application may also be other replacements or equivalent variation forms of various operations in the above steps, and the embodiment of the present application does not limit an operation process or an operation manner used by each step.

It should be further understood that, in various embodiments of the present application, values of sequence numbers of the above-mentioned various processes do not mean an order of execution which should be determined based upon functionalities and internal logics thereof, rather than setting any limitation to implementation of the embodiment of the present application.

It should be noted that each embodiment of the resistor electrode material preparation method listed above may be performed by a robot or in a numerical control machining manner. Device software or process for executing a resistor electrode material preparation method may execute the above electrode material preparation method by executing a computer program code stored in a memory.

Those of ordinary skill in the art may be aware that, units and algorithm steps of the examples described in the embodiments disclosed in this paper may be implemented by electronic hardware, computer software, or a combination of the two. Whether these functions are performed by hardware or software depends on particular applications and designed constraint conditions of the technical solutions. A person skilled in the art may use different methods to implement the described functions for each particular application, but it should not be considered that the implementation goes beyond the scope of this application.

Described above are specific embodiments of the present application only, but the protection scope of the embodiments of present application is not limited thereto, those skilled who are familiar with the art could readily think of variations or substitutions within the technical scope disclosed by the present application, and these variations or substitutions shall fall within the protection scope of the present application. Therefore, the protection scope of the present application shall be subject to the protection scope of the claims.

What is claimed is:

1. A memristor electrode material preparation method, comprising:
    depositing a metal nitride on a substrate by a plasma enhanced atomic layer deposition process to obtain a metal nitride substrate;

subjecting the metal nitride substrate obtained by the plasma enhanced atomic layer deposition process to laser annealing treatment under vacuum, to obtain a memristor electrode material used for preparing electrodes of memristors of a resistive memory;

wherein the depositing the metal nitride on the substrate by the plasma enhanced atomic layer deposition process comprises:

in a first stage, introducing a metal precursor into a chamber in which the substrate is placed, the metal precursor comprising a metal in the metal nitride;

in a second stage, introducing a purge gas into the chamber to discharge the metal precursor that is not adsorbed on the substrate from the chamber;

in a third stage, introducing a reactive gas into the chamber, and initiating a chemical reaction between the reactive gas and the metal precursor adsorbed on the substrate in a plasma enhanced manner to obtain the metal nitride, wherein the reactive gas is a nitrogen-containing gas; and in a fourth stage, discharging a by-product of the reaction and the remaining reactive gas from the chamber by a purge gas.

2. The preparation method according to claim 1, wherein an energy parameter of laser used in the laser annealing enables energy generated by the laser to be greater than or equal to energy required for a metal nitridation reaction, and to be less than energy required to cause material damage to the metal nitride.

3. The preparation method according to claim 1, wherein the method further comprises:

cleaning and drying the metal nitride substrate subjected to the laser annealing treatment.

4. The preparation method according to claim 1, wherein the substrate is a silicon wafer.

5. The preparation method according to claim 4, wherein the silicon wafer comprises a specific circuit structure for controlling switching of a resistance state of the memristor of the resistive memory.

6. The preparation method according to claim 1, wherein the nitrogen-containing atmosphere comprises at least one of nitrogen, ammonia, and a mixed gas of nitrogen and hydrogen.

7. The preparation method according to claim 1, wherein the nitrogen-containing gas comprises at least one of the following gases: nitrogen, ammonia, and a mixed gas of nitrogen and hydrogen.

8. A memristor electrode material preparation apparatus, comprising:

a first device, configured to execute a plasma enhanced atomic layer deposition process to deposit a metal nitride on a substrate to obtain a metal nitride substrate;

a second device, configured to subject the metal nitride substrate to laser annealing treatment to obtain a memristor electrode material for preparing electrodes of memristors of a resistive memory, wherein the second device is configured in a vacuum environment; and a vacuum chamber, configured to connect the first device and the second device under vacuum;

wherein the first device comprises a first chamber provided with a working table, a valve and a plasma generating apparatus, wherein the working table is configured to place a substrate to be processed, the valve is configured to controlling inflow and outflow as well as volume of flow of a gas during execution of the plasma enhanced atomic layer deposition process, and the plasma generating apparatus is configured to generate plasma; and the second device comprises a second chamber provided with a laser, and a laser beam generated by the laser is used for annealing the metal nitride substrate.

9. The preparation apparatus according to claim 8, wherein a first gate is disposed between the first device and the vacuum chamber, and a second gate is disposed between the second device and the vacuum chamber, wherein, after the metal nitride substrate is obtained, the first gate is opened to move the metal nitride substrate to the vacuum chamber, then the first gate is closed and the second gate is opened to move the metal nitride substrate to the second chamber.

10. The preparation apparatus according to claim 8, wherein a performance index of the metal nitride satisfies the following conditions:

resistivity is lower than a first threshold, residual of a carbon element is lower than a second threshold, an oxygen content is lower than a third threshold, and an absolute value of a difference between a ratio between a number of atoms of metal and a number of atoms of nitrogen, and 1 is less than a fourth threshold.

11. The preparation apparatus according to claim 10, wherein the first threshold is 100 micro-ohm centimeters, the second threshold is 1 atom percent, the third threshold is 10 atom percent, and the four threshold is 0.1.

12. A memristor electrode material of a memristor of a resistive memory, wherein the memristor electrode material is at least prepared by:

depositing a metal nitride on a substrate by a plasma enhanced atomic layer deposition process to obtain a metal nitride substrate; and subjecting the metal nitride substrate obtained by the plasma enhanced atomic layer deposition process to laser annealing treatment under vacuum;

wherein the depositing the metal nitride on the substrate by the plasma enhanced atomic layer deposition process comprises:

in a first stage, introducing a metal precursor into a chamber in which the substrate is placed, the metal precursor comprising a metal in the metal nitride;

in a second stage, introducing a purge gas into the chamber to discharge the metal precursor that is not adsorbed on the substrate from the chamber;

in a third stage, introducing a reactive gas into the chamber, and initiating a chemical reaction between the reactive gas and the metal precursor adsorbed on the substrate in a plasma enhanced manner to obtain the metal nitride, wherein the reactive gas is a nitrogen-containing gas; and in a fourth stage, discharging a by-product of the reaction and the remaining reactive gas from the chamber by a purge gas.

13. The memristor electrode material according to claim 12, wherein a performance index of a metal nitride in the memristor electrode material satisfies the following conditions:

resistivity is lower than a first threshold, residual of a carbon element is lower than a second threshold, an oxygen content is lower than a third threshold, and an absolute value of a difference between a ratio between a number of atoms of metal and a number of atoms of nitrogen, and 1 is less than a fourth threshold.

14. The memristor electrode material according to claim 13, wherein the first threshold is 100 micro-ohm centimeters, the second threshold is 1 atom percent, the third threshold is 10 atom percent, and the four threshold is 0.1.

15. The memristor electrode material according to claim 12, wherein an energy parameter of laser used in the laser annealing enables energy generated by the laser to be greater than or equal to energy required for a metal nitridation reaction, and to be less than energy required to cause material damage to the metal nitride.

16. The memristor electrode material according to claim 12, wherein the memristor electrode material is also prepared by:
   cleaning and drying the metal nitride substrate subjected to the laser annealing treatment.

17. The memristor electrode material according to claim 12, wherein the nitrogen-containing atmosphere comprises at least one of nitrogen, ammonia, and a mixed gas of nitrogen and hydrogen.

18. The preparation method according to claim 1, wherein the method further comprises:
   determining a type of laser used for the laser annealing according to a transmittance of the metal nitride.

19. The preparation apparatus according to claim 8, wherein a type of laser used for the laser annealing is determined by a transmittance of the metal nitride.

20. The memristor electrode material according to claim 12, wherein a type of laser used for the laser annealing is determined by a transmittance of the metal nitride.

* * * * *